US 11,444,632 B2

(12) United States Patent
Sen et al.

(10) Patent No.: US 11,444,632 B2
(45) Date of Patent: Sep. 13, 2022

(54) TRACKING ANALOG-TO-DIGITAL CONVERTER FOR POWER CONVERTERS

(71) Applicant: Infineon Technologies Austria AG, Villach (AT)

(72) Inventors: Sujata Sen, Marina Del Rey, CA (US); Mattia Oddicini, Redondo Beach, CA (US); Luca Petruzzi, Andover, NJ (US); Benjamim Tang, Rancho Palos Verdes, CA (US)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/077,475

(22) Filed: Oct. 22, 2020

(65) Prior Publication Data

US 2022/0131552 A1 Apr. 28, 2022

(51) Int. Cl.
*H03M 1/36* (2006.01)
*H02M 3/157* (2006.01)

(52) U.S. Cl.
CPC .......... *H03M 1/362* (2013.01); *H02M 3/157* (2013.01)

(58) Field of Classification Search
CPC ...... H03M 1/165; H03M 1/345; H03M 1/361; H03M 1/363; H03M 1/365; H03M 1/362; H02M 3/157
See application file for complete search history.

(56) References Cited

U.S. PATENT DOCUMENTS

| 10,763,888 | B1* | 9/2020 | Zhang | H03M 3/37 |
| 2008/0180289 | A1* | 7/2008 | Su | H03M 1/1009 |
| | | | | 341/120 |
| 2010/0008459 | A1* | 1/2010 | Eldredge | H04L 7/033 |
| | | | | 375/371 |

OTHER PUBLICATIONS

Brogueira, Joao, "Tracking ADC for Digitally Controlled DC-DC Converters", Institute Superior Tecnico, ULisboa, pp. 1-10.
Bryant, James, et al., "Data Converters", Linear Design Seminar, Section 5, pp. 1-74.
Pratas, Frederico, et al., "Asynchronous Tracking ADC for Digitally Controlled DC-DC Converters", INESC-ID/IST TULisbon, Portugal, SiliconGate, Portugal, 2011.
(Continued)

*Primary Examiner* — Patrick C Chen
(74) *Attorney, Agent, or Firm* — Murphy, Bilak & Homiller, PLLC

(57) ABSTRACT

A tracking analog-to-digital converter (ADC) for a power converter includes a first tracking loop and a second tracking loop. The first tracking loop is configured to track a voltage input to the tracking ADC using one or more comparators and has a re-clocking circuit to mitigate the impact of comparator output metastability, but introduces multi-cycle latency which increases a residual error of the voltage tracking provided by the first tracking loop. The second tracking loop is configured to supplement the voltage tracking provided by the first tracking loop and to reduce the residual error of the voltage tracking for dynamic changes at the voltage input. The second tracking loop has a single-cycle latency and is implemented with logic that is less sensitive to logic errors due to comparator metastability. Corresponding methods of voltage tracking and an electronic system are also described.

22 Claims, 12 Drawing Sheets

(56) References Cited

OTHER PUBLICATIONS

Balasubramanian, K, et al., "A Novel High Performance Adaptive Delta Modulator", Instrumentation and Measurement Technology Conference; Proceedings of the 16th IEEE, Venice Italy, May 24, 1999, pp. 204-208.
Bo, Ning, et al., "Implementation of an Adaptive Delta Modulation Codec in Speech Record/playback Chip", Institute of Microelectronics; 2008 International Symposium on Semiconductor Manufacturing (ISSM), IEEE, Oct. 21, 2003, pp. 938-941.
Bramburger, Stefan, et al., "10-bit tracking ADC with a multi-bit quantizer, variable step size and segmented current-steering DAC", Advances in Radio Science, 17, Jan. 1, 2019, pp. 161-167.
Doerrer, Lukas, et al., "A 3-mW 74-dB SNR 2-MHz Continuous-Time Delta-Sigma ADC With a Tracking ADC Quantizer in 0.13-μm CMOS", IEEE Journal of Solid-State Circuits, vol. 40, No. 12, Dec. 2005, pp. 2416-2427.
Huang, Yan, et al., "A current mode 6-bit self-clocked tracking ADC with adaptive clock frequency for DC-DC converters", 2013 IEEE International Symposium, May 19, 2013, pp. 145-148.
Last, Thomas A., "Proportional step size tracking analog-to-digital converter", Review of Scientific Instruments, vol. 51, No. 3, Mar. 1980, pp. 1-79.

\* cited by examiner

| cmp_plus_o | cmp_mid_o | cmp_minus_o | Step Size | Comment |
|---|---|---|---|---|
| 0 | 0 | 0 | + HIGH STEP | max negative error |
| 0 | 0 | 1 | 1 | steady state negative error |
| 0 | 1 | 0 | -1 | disagreement between middle and down comparator |
| 0 | 1 | 1 | -1 | steady state positive error |
| 1 | 0 | 0 | 1 | disagreement between plus and middle/down comparator |
| 1 | 0 | 1 | 1 | disagreement between middle and plus comparator |
| 1 | 1 | 0 | -1 | disagreement between minus and middle/up comparator |
| 1 | 1 | 1 | - HIGH STEP | max positive error |

*FIGURE 10*

TRACKING ANALOG-TO-DIGITAL CONVERTER FOR POWER CONVERTERS

BACKGROUND

Active transient response (ATR) is a common feature in power converter controllers for identifying voltage overshoot and undershoot conditions. An ATRL event indicates a voltage overshoot on the converter output, whereas an ATRH event indicates a voltage droop on the converter output.

Many applications require ATRL/ATRH events to be detected at up to 500 mV/us slew rates with minimal latency. However, conventional voltage tracking circuits that measure the output voltage of a power converter suffer from slow ATRL (voltage overshoot) detection during a load release. Jitter from a slow tracking loop bandwidth and related metastability issues result in slow controller response time, degrading converter performance during dynamic response, particularly with nonlinear voltage error enhanced response such as ATR, and yielding slow fault detection of overvoltage and undervoltage conditions.

Thus, there is a need for an improved voltage tracking circuit for power converters.

SUMMARY

According to an embodiment of a tracking analog-to-digital converter (ADC), the tracking ADC comprises: a first tracking loop configured to track a voltage input to the tracking ADC, the first tracking loop having a multi-cycle latency which increases a residual error of the voltage tracking provided by the first tracking loop; and a second tracking loop configured to supplement the voltage tracking provided by the first tracking loop and to reduce the residual error of the voltage tracking for dynamic changes at the voltage input, the second tracking loop having a single-cycle latency.

According to an embodiment of a method of tracking a voltage via a tracking ADC, the method comprises: tracking, via a first tracking loop of the tracking ADC, a voltage input to the tracking ADC, the first tracking loop having a multi-cycle latency which increases a residual error of the voltage tracking provided by the first tracking loop; and supplementing, via a second tracking loop of the tracking ADC, the voltage tracking provided by the first tracking loop and reducing the residual error of the voltage tracking for dynamic changes at the voltage input, the second tracking loop having a single-cycle latency.

According to an embodiment of an electronic system, the electronic system comprises: a circuit board; a load attached to the circuit board; and a power converter configured to provide an output voltage to the load. The power converter comprises: at least one phase configured to provide a phase current to the load; and a controller configured to control switching of the at least one phase, wherein the controller comprises a tracking analog-to-digital converter (ADC) configured to measure the output voltage, wherein the tracking ADC comprises: a first tracking loop configured to track the output voltage, the first tracking loop having a multi-cycle latency which increases a residual error of the voltage tracking provided by the first tracking loop; and a second tracking loop configured to supplement the voltage tracking provided by the first tracking loop and reduce the residual error of the voltage tracking for dynamic changes in the output voltage, the second tracking loop having a single-cycle latency.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 10 illustrates a tabular diagram of a three-comparator embodiment of the tracking ADC comparator function.

DETAILED DESCRIPTION

Figure 1:
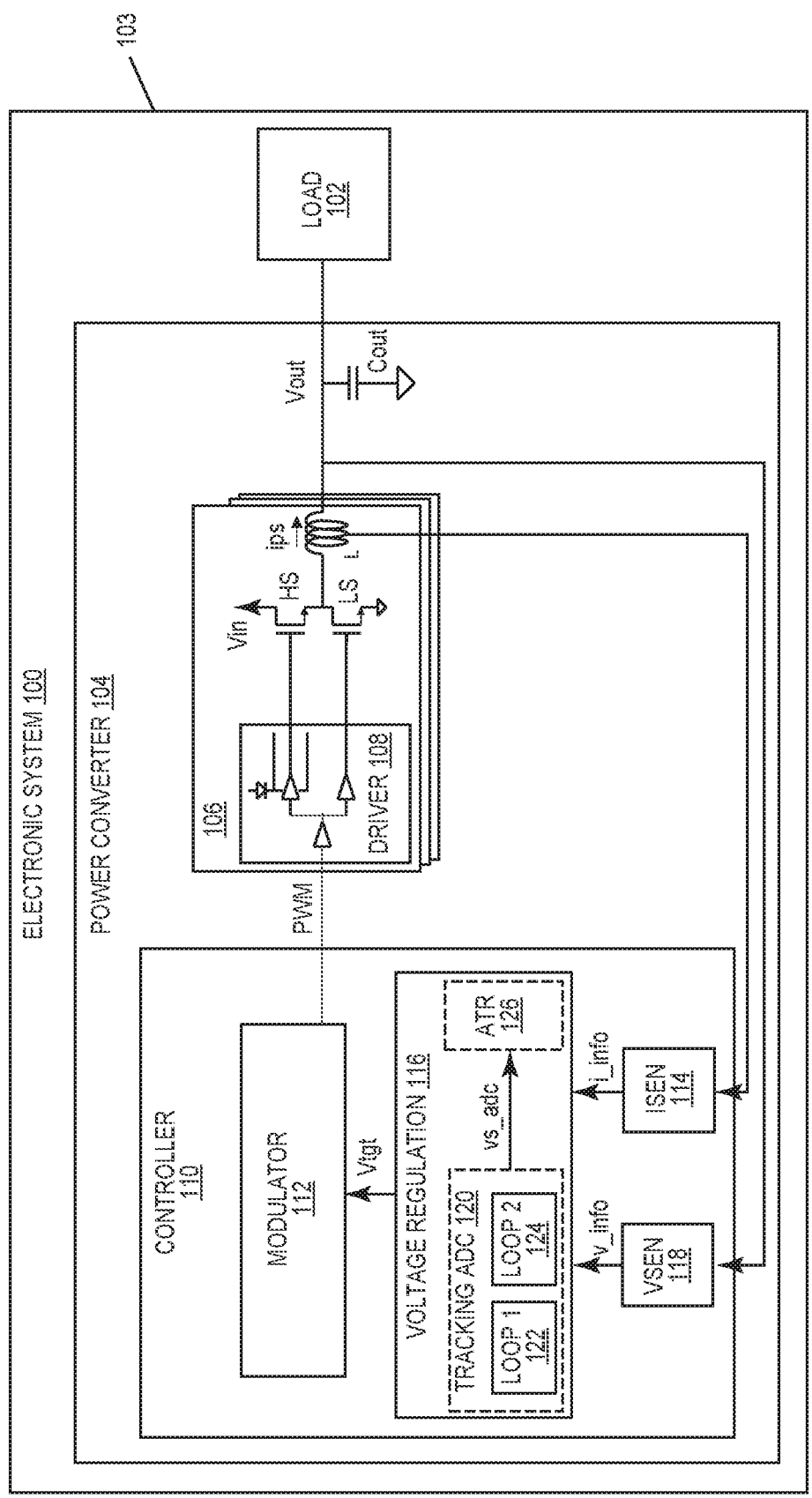
FIG. 1 illustrates a block diagram of an embodiment of an electronic system that includes a load attached to a board, and a power converter configured to regulate an output voltage provided to the load.

The embodiments described herein provide an improved voltage tracking circuit for power converters, corresponding methods of voltage tracking, and an electronic system. The voltage tracking circuit tracks the output voltage of a power converter using a tracking analog-to-digital converter (ADC), and the power converter controller uses the tracked output voltage information to implement voltage regulation and ATR, among other functions. The tracking ADC has one or more comparators that compare a representation of the output voltage, either connected directly to the output or through resistor dividers, buffer amplifiers, etc. and an internal representation including one or more digital-to-analog converters (DACs), such that the tracking ADC minimizes the difference or error in the two representations, and the internal representation tracks the output voltage by driving the tracking loop so that the magnitude of the comparator inputs, representing the tracking error, is minimized. The comparator inputs may be a very small differential value, and since the comparator is clocked with a high speed clock (e.g. 200 MHz or higher), and there is a potential of metastability at the comparator output, where the comparator output does not meet the signal level and timing criteria to be recognized as either a level of '0' or '1' with 100% probability, and may cause logic function failure in any logic circuitry using the comparator output as an input, particularly when connected to multiple gates where each gate may resolve the input to a different logic level. The metastable output may be mitigated by re-clocking the signal using an additional latch or flip-flop, such that the additional gain provided by the additional circuit, greatly reduces the probability of having a metastable output. The tracking ADC has first and second tracking loops driven by the comparator outputs.

A first tracking loop tracks the voltage input to the tracking ADC by adjusting the codes to a DAC based on the comparator output, but this tracking logic may be sensitive to logic errors due to comparator output metastability at its input. The first tracking loop includes a latch to re-clock the comparator output, mitigating the possibility of circuit logic failure due to comparator output metastability, but which results in multi-cycle latency. The multi-cycle latency increases a residual error of the voltage tracking provided by the first tracking loop. To mitigate the effects of the multi-cycle latency of the first tracking loop, a second tracking loop is designed to operate directly with the comparator output with single cycle latency, by using circuitry which is less sensitive to logic errors due to metastability. The second tracking loop supplements the voltage tracking provided by the first tracking loop and reduces the residual error of the voltage tracking for dynamic changes at the voltage input.

The voltage tracking circuit and methods described herein: mitigate comparator metastability; are robust to bit, computation, and settling errors in the second tracking loop; improve robustness in the DC path of the first tracking loop due to additional time to perform computations and resolve comparator output; allow more time for digital processing/computation for more sophisticated tracking algorithms for improved dynamic response; minimize limit cycles in tracking loop; reduce tracking jitter under dynamic conditions; and provide improved transient response.

Described next are embodiments of the voltage tracking circuit, methods of voltage tracking, and an electronic system that includes the voltage tracking circuit.

FIG. 1 illustrates an embodiment of an electronic system 100 that includes a load 102 attached to a board 103 such as a PCB (printed circuit board), and a power converter 104 configured to regulate an output voltage (Vout) provided to the load 102. The power converter 104 is shown as a buck converter in FIG. 1 merely as an example. In this example, the power converter 104 includes one or more power stages 106, each power stage 106 forming a phase of the power converter 104. The power converter 104 may be single-phase (one power stage 106) or multi-phase (more than one power stage 106).

The term "power converter" as used herein broadly refers to any type of power converter or voltage regulator (VR) that provides one or more regulated voltages to one or more electronic loads 102 such as an Ethernet switch, an ASIC (application-specification integrated circuit), a memory device, a processor such as a central processing unit (CPU), microprocessor, graphics processing unit (GPU), digital signal processor (DSP), artificial intelligence (AI) accelerator, image processor, network or packet processor, coprocessor, multi-core processor, front-end processor, baseband processor, etc. For example, the power converter 104 may be a buck converter as shown in FIG. 1, a boost converter, a buck-boost converter, a switched capacitor voltage regulator, a step-down converter, a point-of-load (POL) power supply, etc. The power converter 104 may be implemented as a power device module.

The term "power device module" as used herein means a packaged functional assembly that includes at least one power switch HS/LS of a power stage 106 used in converting a voltage from one level to another level, e.g., as is done in power conversion and voltage regulation. The power device module may also include a driver circuit 108 for driving the at least one power switch HS/LS. The power device module may additionally include a controller 110 for controlling the driver circuit 108 so as to implement the power converter 104. The controller and/or driver functionality may instead be implemented outside the power device module. The driver circuit 108 for the at least one power switch HS/LS included in the power device module also may be outside the power device module. Various passive components such as capacitors (Cout) and/or inductors (L) that make up the power converter 104 may be included in the power device module, surface mounted to the power device module, located on a separate board, etc.

Each power stage 106 of the power converter 104 is configured to provide a current (ips) to the load 102 through a respective inductor L and an output capacitor Cout which reduces output voltage ripple. The controller 110 generates a switching control signal (PWM) for each (single or multi) phase so as to regulate the output voltage Vout provided to the load 102.

The power converter controller 110 includes a modulator 112 for generating the switching control signal PWM for each phase, to regulate the output voltage Vout provided to the load 102. In one embodiment, the modulator 112 implements pulse width modulation (PWM).

The power converter controller 110 may also include a current sense (ISEN) circuit 114 for sensing the phase current ips delivered by each power stage 106 and providing the sensed current information (i_info) to a voltage regulation circuit 116 included in the controller 110. The voltage regulation circuit 116 updates a target voltage value 'Vtgt' based on changes in the sensed current information i_info, to regulate the output voltage Vout of the power converter 104 based on the updated target value. The current sense circuit 114 may implement any current sensing technique. For example, in the case of PWM modulation, the current sense circuit 114 may update the current information i_info at the beginning or end of each PWM pulse. The current sense circuit 114 may also implement overcurrent protection and/or provide current telemetry information over an output pin (not shown) of the controller 110.

The power converter controller 110 may also include a voltage sense (VSEN) circuit 118 for sensing the output voltage Vout of the power converter 104 and providing the sensed voltage information (v_info) to the voltage regulation circuit 116. A tracking ADC 120 included in or associated with the voltage regulation circuit 116 tracks the output voltage Vout of the power converter based on the voltage information v_info sensed by the voltage sense circuit 118. The tracking ADC 120 includes a first tracking loop 122 for tracking the sensed voltage input to the tracking ADC 120. The first tracking loop 122 has a multi-cycle latency, so the comparator output does not affect the tracked value in the first tracking loop 122 in the subsequent clock cycle, which increases a residual error of the voltage tracking provided by the first tracking loop 122. The tracking ADC 120 further includes a second tracking loop 124 for supplementing the voltage tracking provided by the first tracking loop 122. The second tracking loop 124 is designed to have a single-cycle latency such that the comparator output affects the tracked value in the second tracking loop 124 in the subsequent clock cycle, thus the second tracking loop 124 reduces the residual error of the voltage tracking for dynamic changes at the voltage input to the tracking ADC 120.

The voltage regulation circuit 116 may update the target voltage value Vtgt based on changes in the voltage tracking information 'vs_adc_o' provided by the tracking ADC 120, to regulate the output voltage Vout of the power converter 104 based on the updated target voltage value Vtgt. The modulator 112 included in the controller 108 generates a switching control signal 'PWM' for each phase of the power converter 104 based on the target voltage Vtgt indicated by the voltage regulation circuit 116. The modulator 112 and the voltage regulation circuit 116 may be implemented as a single unit or as separate units, in the analog and/or digital domain.

During ON periods of the switching control signal 'PWM', the high-side switch device 'HS' of each power stage 106 connects the corresponding inductor L to a supply voltage (Vin). The low-side switch device 'LS' of the power stage 106 connects the inductor L to ground or another reference potential during OFF periods of the switching control signal 'PWM'. The high-side and low-side switch devices 'HS', 'LS' may be power MSOFETs (metal-oxide-semiconductor field effect transistors), IGBTs (insulated gate bipolar transistors), HEMTs (high-electron mobility transistors), etc. The duration of the ON and OFF periods and timing transitions therebetween are indicated by the corresponding switching control signal 'PWM' provide by the modulator 112.

An active transient response (ATR) circuit 126 included in or associated with the voltage regulation circuit 116 detects dynamic changes in the converter output voltage Vout based on the voltage tracking information vs_adc_o provided by the tracking ADC 120. Dynamic changes may include sudden and substantial increases or decreases in the output voltage Vout, as indicated by the voltage tracking information vs_adc_o provided by the tracking ADC 120. Such changes in the power converter output voltage Vout may arise due to a load release or in response to a sudden increase in load current. The ATR circuit 126 may activate an ATRL signal to indicate a voltage overshoot on the converter output Vout or an ARTH signal to indicate a voltage droop on the converter output Vout. In either case, the response time of the ATR circuit 126 depends at least in part on the transient response of the tracking ADC 120 during dynamic load changes.

Figure 2:
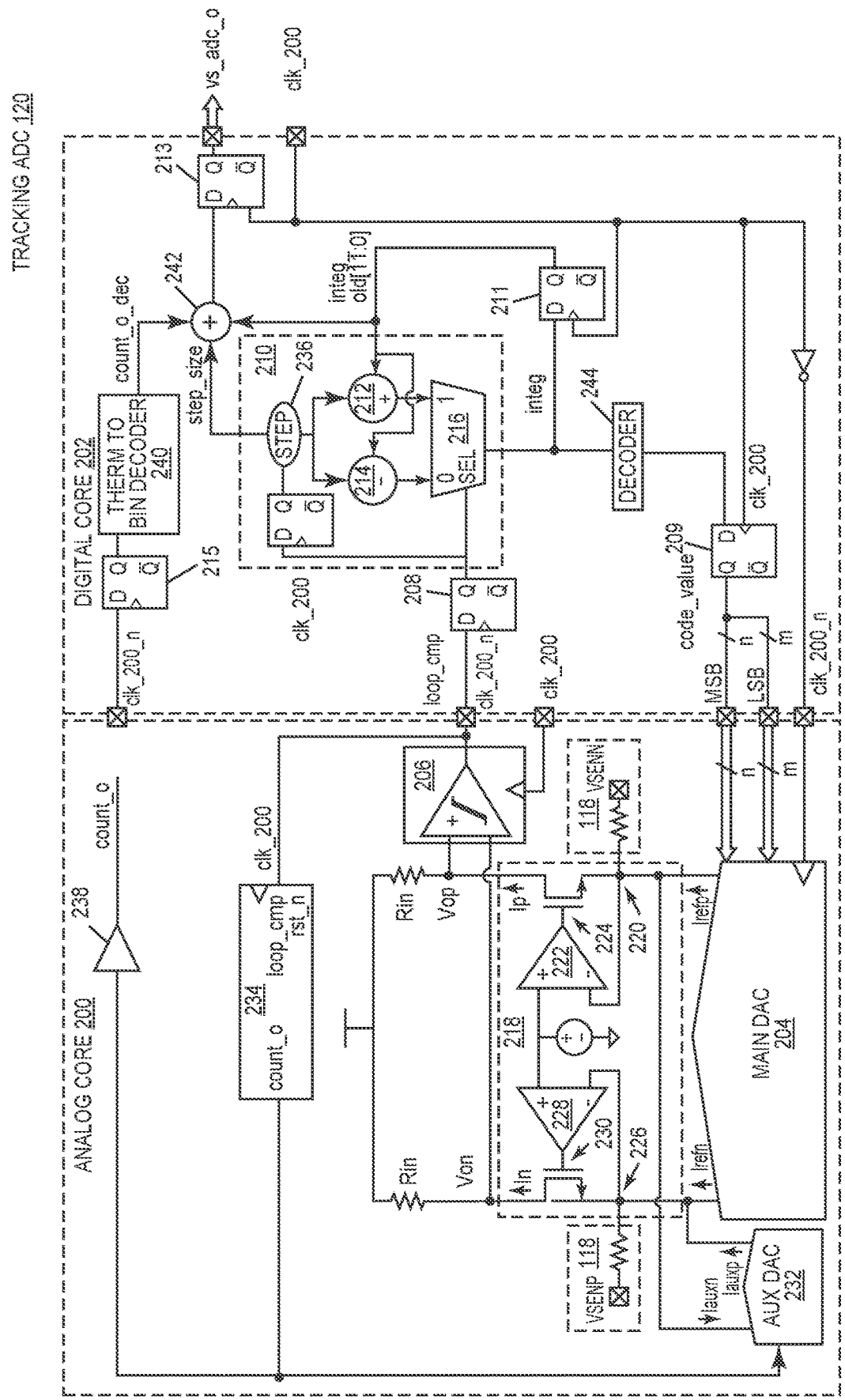
FIG. 2 illustrates a schematic diagram of an embodiment of a tracking ADC included in the power converter shown in FIG. 1.

FIG. 2 illustrates an embodiment of the tracking ADC 120. The tracking ADC 120 includes an analog core 200 and a digital core 202. The analog core 200 and the digital core 202 may be implemented on the same chip (die). According to the embodiment illustrated in FIG. 2, the first tracking loop 122 of the tracking ADC 120 is implemented partly in the analog core 200 and partly in the digital core 202. For example, the first tracking loop 122 may include a first (main) digital-to-analog converter (DAC) 204 in the analog core 200, a comparator 206 in the analog core, and a first latch 208 such as a D flip-flop in the digital core 202.

The first DAC 204 generates a first tracking reference adjustment that corresponds to a code value 'code_value' input to the first DAC 204 each clock cycle. The code value has n most significant bits (MSB) and m least significant bits (LSB), where n and m are positive integers. The first tracking loop 122 of the tracking ADC 120 may also include logic 210 such as an integrator in the digital core 202 for updating the code value input to the first DAC 204 each clock cycle based on the error value captured by the comparator 206 but re-clocked by the first latch 208 for the immediately preceding clock cycle; hence the multi-cycle latency for the first tracking loop 122 from the comparator 206 sample, to the update of the main DAC 204. This particular embodiment utilizes positive edge clocking of the comparator 206 and register 209, and negative clock edge clocking of the first latch 208 and main DAC 204, resulting in a 2 clock cycle latency. In the case of an integrator, the code update logic 210 may include an incrementer 212, a decrementer 214 and a multiplexer 216, and the first (re-clock) latch 208 reduces the impact of metastability of the comparator 206 output affecting the code update logic 210, since the first latch 208 resolves its metastable input into either a logic '0' or logic '1' at its output so that it does not affect the code update logic 210, whereas driving the code update logic 210 directly with a metastable input would result in possible inconsistent resolution of the logic level among the many gates in the code update logic 210. Operation of the code update logic 210 is described in more detail later herein.

The comparator 206 of the first tracking loop 122 generates an error value 'loop_cmp' each clock cycle based on both the voltage input to the tracking ADC 120 at positive and negative terminals VSENP, VSENN of the voltage sense circuit 118 and the first tracking reference adjustment generated by the first DAC 204. The first latch 208 stores the error value generated by the comparator 206 each clock cycle. The first latch 208 avoids metastability, but results in multi-cycle latency for the first tracking loop 122.

The metastability mitigated by the first latch 208 arises in the comparator 206. The comparator 206 may be implemented as an analog, dynamic, differential latch which operates close to 0 mV differential at steady state. When the latch is clocked by 'clk_200', the outputs of the latch slew exponentially towards the supply and ground voltages of the latch. The propagation delay is dependent on the initial differential input voltage and the time constant. Such a latch has a probability of metastability which is dependent exponentially on the amount of time after the rising edge of the latch clock. For slow process (e.g. long channel length), low voltage, and high temperature corners, the latch metastablility rate increases. The slowest corner also requires longer time for the logic of the digital core 202 to propagate. This causes a significant probability in the slowest corner that the output of the latch would be metastable. If the latch output loop_cmp is metastable, then bits of the code update logic 210 might violate the setup time and still be transitioning when the latches 208, 209, 211, 213, 215 of the digital core 202 are clocked. This would lead to the bits of the code update logic 210 becoming scrambled when the DAC inputs are clocked causing large errors in the tracking ADC output code vs_adc_o. Such large jumps in error would take a long time to recover from, since the first tracking loop 122 has limited step sizes. A large error would also falsely trigger under and/or over voltage faults by the ATR circuit 126 and cause the system 100 to stop regulation of the output voltage Vout. Including the first latch 208 in the first tracking loop 122 of the tracking ADC 120 mitigates these problems.

The comparator 206 of the first tracking loop 122 is actuated based on an edge of a clock signal 'clk_200' that sets the frequency of each clock cycle. The first latch 208 is actuated a fixed time after the comparator 206 but before the clock cycle is completed. For example, alternate clock edges may be used to actuate the comparator 206 and the first latch 208. In another example, the same (rising or falling) edge used to actuate the comparator 206 may be used to actuate the first latch 208 but on the next cycle. In yet another example, the same (rising or falling) edge used to actuate the comparator 206 may be used to actuate the first 208 latch but on a delayed clock. In each case, actuation of the first latch 208 happens after the comparator decision to avoid metastable operation of the first tracking loop 120.

Although a single comparator 206 and a single first latch 208 are shown in FIG. 2, the first tracking loop 122 may include a plurality of comparators 206 for generating a multi-level representation of the error value loop_cmp and a plurality of first latches 208 for storing the values of the comparators 206 in the digital core 202.

The first tracking loop 120 of the tracking ADC 120 may further include an input 218 for generating a differential current In/Ip that corresponds to the voltage input to the tracking ADC 120. The tracking ADC 120 digitizes the error voltage Verror using the differential input current In/Ip which is equal to the difference between VSENP and VSENN divided by the input resistance Rin.

A first summing node 220 of the first tracking loop 120 is coupled to a first differential leg of the input 218 formed by a first operational amplifier 220 and a first transistor 222. A second summing node 226 of the first tracking loop 120 is coupled to a second differential leg of the input 218 formed by a second operational amplifier 228 and a second transistor 230. The first DAC 204 injects a tracking reference current adjustment Irefp, Irefn into at least one of the first and second summing nodes 220, 226. The differential current at the first and second summing nodes 220, 226 is converted to a differential voltage Von/Vop at the input of the comparator 206 by respective input resistors Rin. The differential voltage Von/Vop at the input of the comparator 206 has a residual error 'Verror' which increases due to the multi-cycle latency of the first tracking loop 122.

The first tracking loop 122 has a multi-cycle latency due to the use of the first latch 208. The first latch 208 mitigates the first tracking loop 1002 metastability but adds latency, which may increase code ripple (error) in the voltage tracking information 'vs_adc_o' provided by the tracking ADC 120, e.g., to the ATR circuit 126. In some cases, the code ripple may be too high, e.g., more than one code value, resulting in poor ATR performance. To mitigate against this, the second tracking loop 124 is provided and designed with a single-cycle latency. Hence, the main (first) tracking loop 122 is implemented with 2 or more cycles of latency whereas the auxiliary (second) tracking loop 124 is implemented with single-cycle latency.

As shown in FIG. 2, the second tracking loop 124 of the tracking ADC 120 may include a second (auxiliary) DAC 232 for generating a second tracking reference adjustment Iauxn/Iauxp based on the error value loop_cmp generated by the comparator 206 of the first tracking loop 122 each clock cycle. For example, the second DAC 232 may add 1 least significant bit (LSB) of current for a positive error value generated by the comparator 206 each clock cycle and subtract 1 LSB of current for a negative error value generated by the comparator 206 each clock cycle. These adjustments reduce the latency of the tracking ADC 120 which improves the output code ripple which in turn improves ATRL detection jitter.

In one embodiment, the second tracking loop 124 of the tracking ADC 120 also includes a counter or similar circuit 234 for generating a count value 'count_o' based on the error value loop_cmp generated by the comparator 206 each clock cycle. In this embodiment, the tracking reference adjustment Iauxn/Iauxp generated by the second DAC 232 corresponds to the count value count_o generated by the counter 234 for the present clock cycle. The counter 234 may be updated at the end of the clock cycle.

In one embodiment, the counter 234 and auxiliary DAC 232 of the second tracking loop 124 may be implemented as follows. The auxiliary DAC 232 may be a unary or thermometer coded DAC with eight or more or less 1 LSB cell weights, where 'thermometer' means logic 1s should be consecutive whereas 'unary' more generically means each bit has the same weight. The auxiliary DAC 232 may operate differentially with a 1 uA cell connecting to either leg of the input 218; equivalent to 1 LSB. The counter 234 may have a clock input 'clk_200', a comparator input 'loop_cmp' and a reset input 'rst_n'. The counter 234 may also have a multi-bit output 'count_o', e.g., 8 bits in length. The counter 234 may be updated at an edge of clk_200. The counter 234 counts up when loop_cmp is high and counts down when loop_cmp is low. The counter 234 is reset by a polarity change of loop_cmp to avoid saturation of the auxiliary DAC 232. That is, the counter 234 has a first reset state that corresponds to a positive to negative change in the polarity of the error value loop_cmp generated by the comparator 206 during a clock cycle and a second reset state that corresponds to a negative to positive change in the polarity of the error value loop_cmp.

The logic operation of the (second tracking loop) counter 234 and auxiliary DAC 232 may be impacted by metastability of the output of comparator 206. However, the limited range and memory of counter 234, the limited range of auxiliary DAC 232, and a unary representation of the thermometer code logic, makes the error introduced to the second tracking loop 124 from a logic error very small compared to the tracking ADC range, and recoverable in a few clock cycles, unlike the (first tracking) code update logic 210.

The auxiliary DAC 232 subtracts 1 LSB of current if the counter 234 enters the first reset state during the clock cycle or adds 1 LSB of current if the counter 234 enters the second reset state during the clock cycle. In a balanced state, the auxiliary DAC 232 may have the same number of cells (e.g. 4) on both legs of the input 218. When loop_cmp goes from low to high, the counter 234 is set to 00011111, for example. When loop_cmp goes from high to low, the counter 234 is set to 00000111, for example. The dual edge-based reset of the counter 234 may happen instantaneously.

Figure 3:
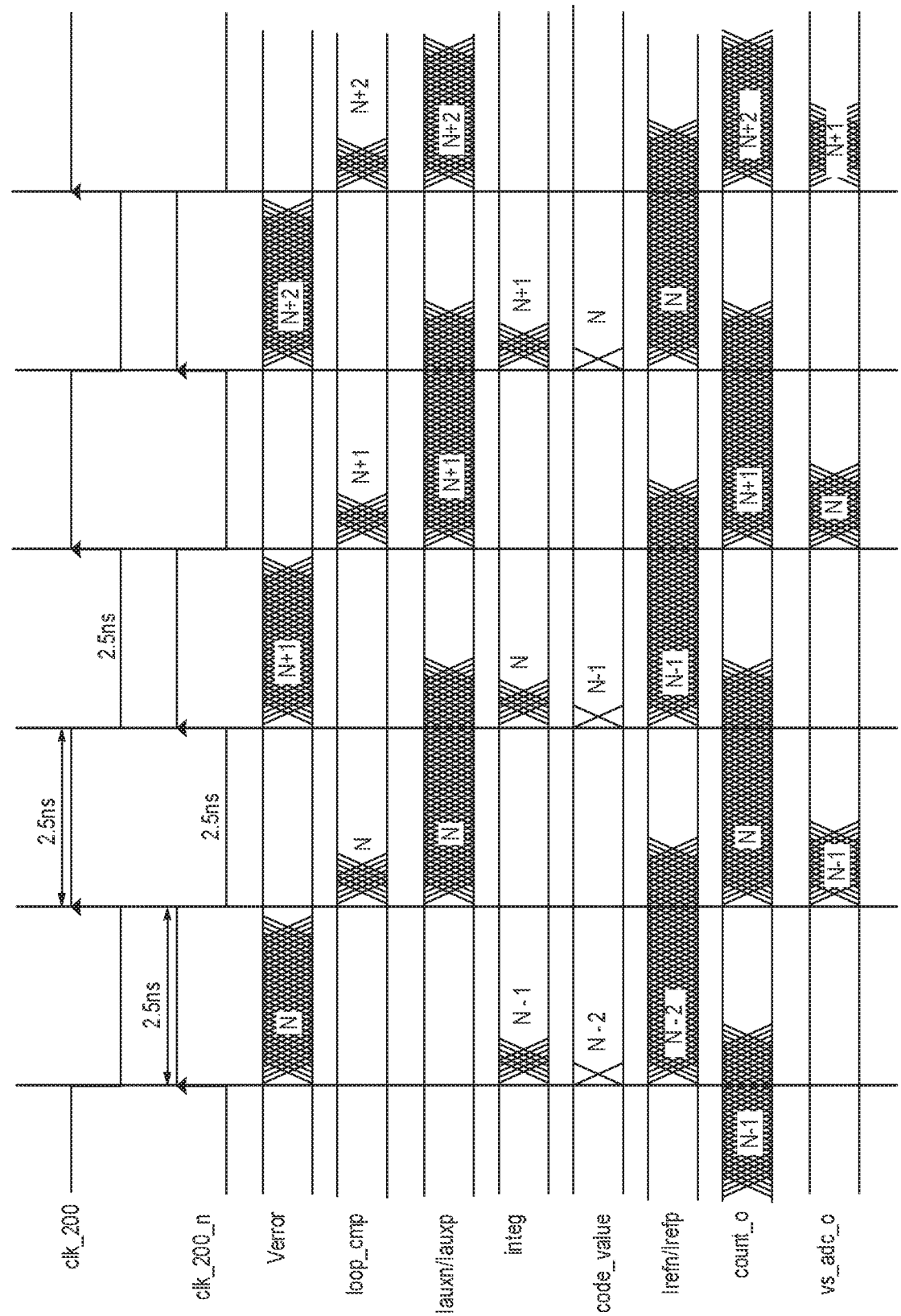
FIGS. 3 through 7 illustrate various waveforms associated with operation of the tracking ADC.

FIG. 3 illustrates a timing diagram associated with the operation of the tracking ADC 120. By inserting the first latch 208 in the first tracking loop 122 of the tracking ADC 120, there is an extra cycle of latency introduced into the first tracking loop 122. Since the code update logic 210 makes the decision of the polarity of the step based on the comparator result loop_cmp one cycle earlier, the result is an extra step towards an incorrect decision before the error voltage reverses polarity. This means that in steady state where there are no dynamic changes in the input to the tracking ADC 120, the first tracking loop 122 would add an extra two codes of ripple in the ADC output vs_adc_o.

To achieve the required speed in steady state, the impedance at the comparator input would need to be low enough for the voltage to settle in one half cycle (e.g. 2.5 ns for a 200 MHz clock signal) when the input voltage changes by 1 LSB (e.g. 1.25 mV). The input resistance Rin is limited by the system requirements for the controller 110 and the current consumption of the tracking ADC 120. The bandwidth of the tracking ADC 120 is limited by Rin*C where C is the parasitic loading at the comparator input. There is a limit on how small the capacitance can be due to the number of stages and gain needed to achieve 1 LSB resolution at the input to the comparator 206. This means that the bandwidth of the first tracking loop 120 would be limited to 100 MHz given the requirement for input impedance and current consumption, in this example.

However, the second tracking loop 124 is provided to mitigate the multi-cycle latency of the first tracking loop 122. The second (auxiliary) DAC 232 of the second tracking loop 124 provides a quick analog feedback to update the overall tracking immediately based on the loop comparator output loop_cmp while the first (main) DAC 204 of the first tracking loop 122 is updated a cycle later. Returning to the 200 MHz clock example, the single-latency second tracking loop 124 allows for an increase of the speed (bandwidth) of the tracking ADC 1120 to 200 MHz with timing improvements to avoid metastability using the auxiliary DAC 232 and counter 234.

The auxiliary DAC 232 may be a small DAC which adds 1 LSB of current for positive values of the loop comparator output loop_cmp and subtracts 1 LSB of current for negative values of the loop comparator output loop_cmp. For certain process corners, the first tracking loop bandwidth may be smaller and the main DAC 204 may not have an adequate slew rate, causing a larger limit cycling behavior with a larger output code ripple. In this case, and instead of adding/subtracting just 1 code, the auxiliary DAC 232 may add/subtract several codes for every consecutive cycle that the tracking loop has the same polarity. The counter 234 included in the second tracking loop 124 tracks for how long the comparator output loop_cmp is the same polarity. The counter 234 counts up/down based on the polarity of the comparator output loop_cmp every time the comparator 206 is clocked. When the loop comparator output loop_cmp changes polarity, the counter 234 may be reset ('rst_n' in FIG. 2) based on a rising or falling edge of the clock clk_200 to a value which would help the tracking loop settle. If the loop comparator output loop_cmp goes from high to low, the error voltage Verror went from positive to negative which means one (or more) LSB of current should be subtracted by the auxiliary DAC 232 to help the first tracking loop 122 slew to the correct direction. If the comparator output loop_cmp goes from low to high, the error voltage Verror slewed form negative to positive which means one (or more) LSB of current should be added by the auxiliary DAC 232 to help the first tracking loop 122 slew to the correct direction. In this embodiment, the counter 234 has two separate reset states based on which direction the polarity of the loop comparator output loop_cmp has changed.

As seen in FIG. 3, the auxiliary DAC 232 can start to update as soon as the loop comparator 206 starts to update. Accordingly, the auxiliary DAC 232 has more time to settle compared to the main DAC 204. For example, for a 200 MHz clock signal clk_200, the main DAC 204 would have 2.5 ns to settle until the comparator 206 is clocked. However, the auxiliary DAC 232 would have up to 5 ns minus the analog dynamic latch propagation time which may be only a few hundred picoseconds.

The residual error Verror at the input of the comparator 206 when the comparator 206 is triggered during clock cycle N is given by:

$$Verror(N)=Vsen(N)-Vdac(N-1) \qquad (1)$$

where Vsen(N) is the tracking ADC input (Vsenp−Vsenn) for clock cycle N and Vdac is the total DAC output (main DAC+auxiliary DAC) from previous clock cycle N−1.

The total DAC output for clock cycle N is given by:

$$Vdac(N)=Vdac\_main(N)+Vdac\_aux(N) \qquad (2)$$

where Vdac_main is the output of the first (main) DAC 204 and Vdac_aux is the output of the second (auxiliary) DAC 204.

The total DAC output for clock cycle N−1 is given by:

$$Vdac(N-1)=Vdac\_main(N-2)+Step+Vdac\_aux(N-1) \qquad (3)$$

where the step size is based on Verror(N−2) and the auxiliary DAC output Vdac_aux(N−1) is based on Verror(N−1). The main DAC Vdac_main(N−2) is updated based on the error from two cycles ago.

Inserting the Vdac(N−1) formulation of equation (3) into equation (1) yields:

$$Verror(N)=Vsen(N)-[Vdac\_main(N-2)+Step+Vdac\_aux(N-1)] \qquad (4)$$

Figure 4:
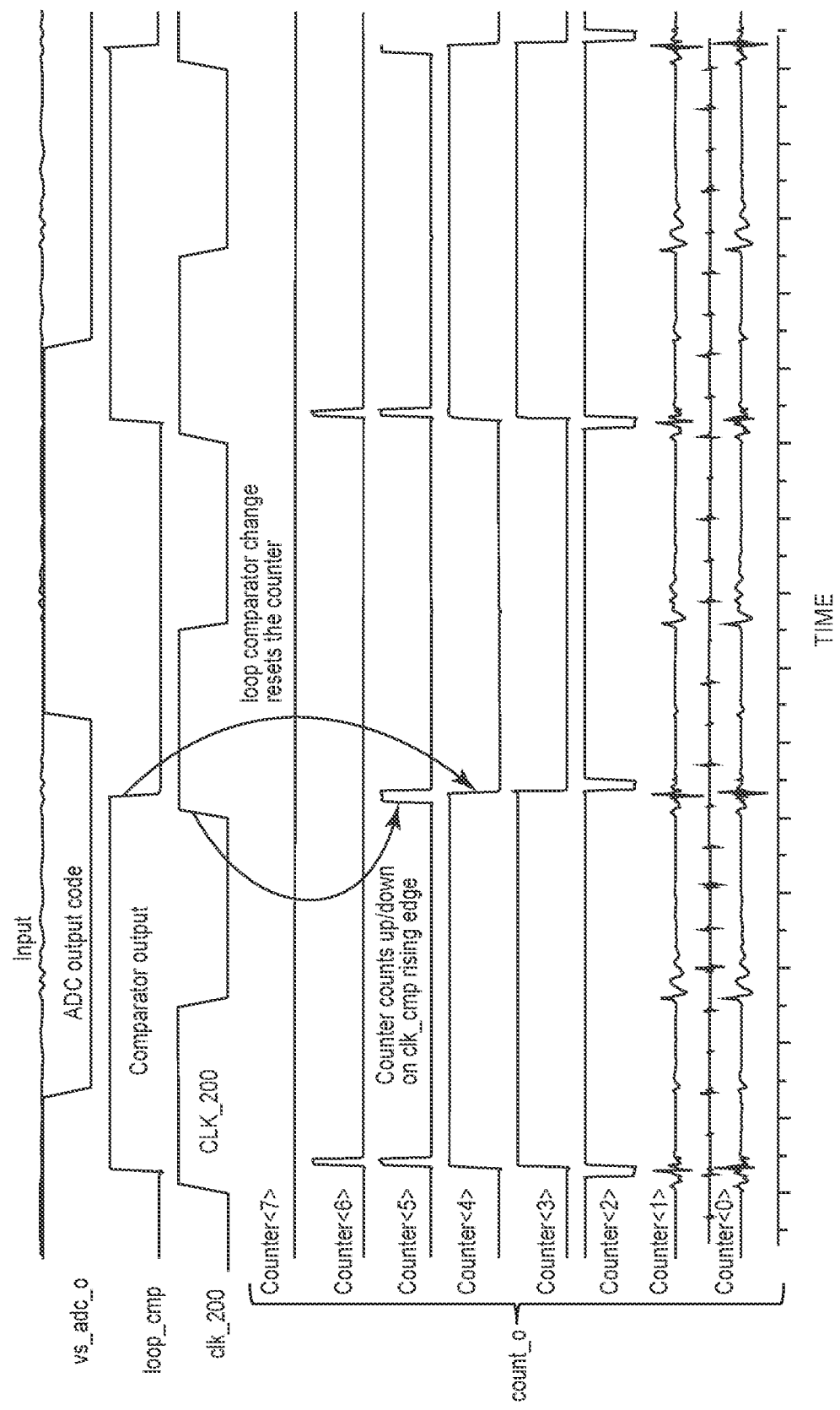

FIG. 4 illustrates a timing diagram of the counter function in steady state. In this example, the output vs_adc_o of the tracking ADC 120 in steady state has one code ripple. Every time the comparator clock clk_200 goes high, the counter 234 begins to count but then the comparator output loop_cmp toggles and the counter 234 resets.

Figure 5:
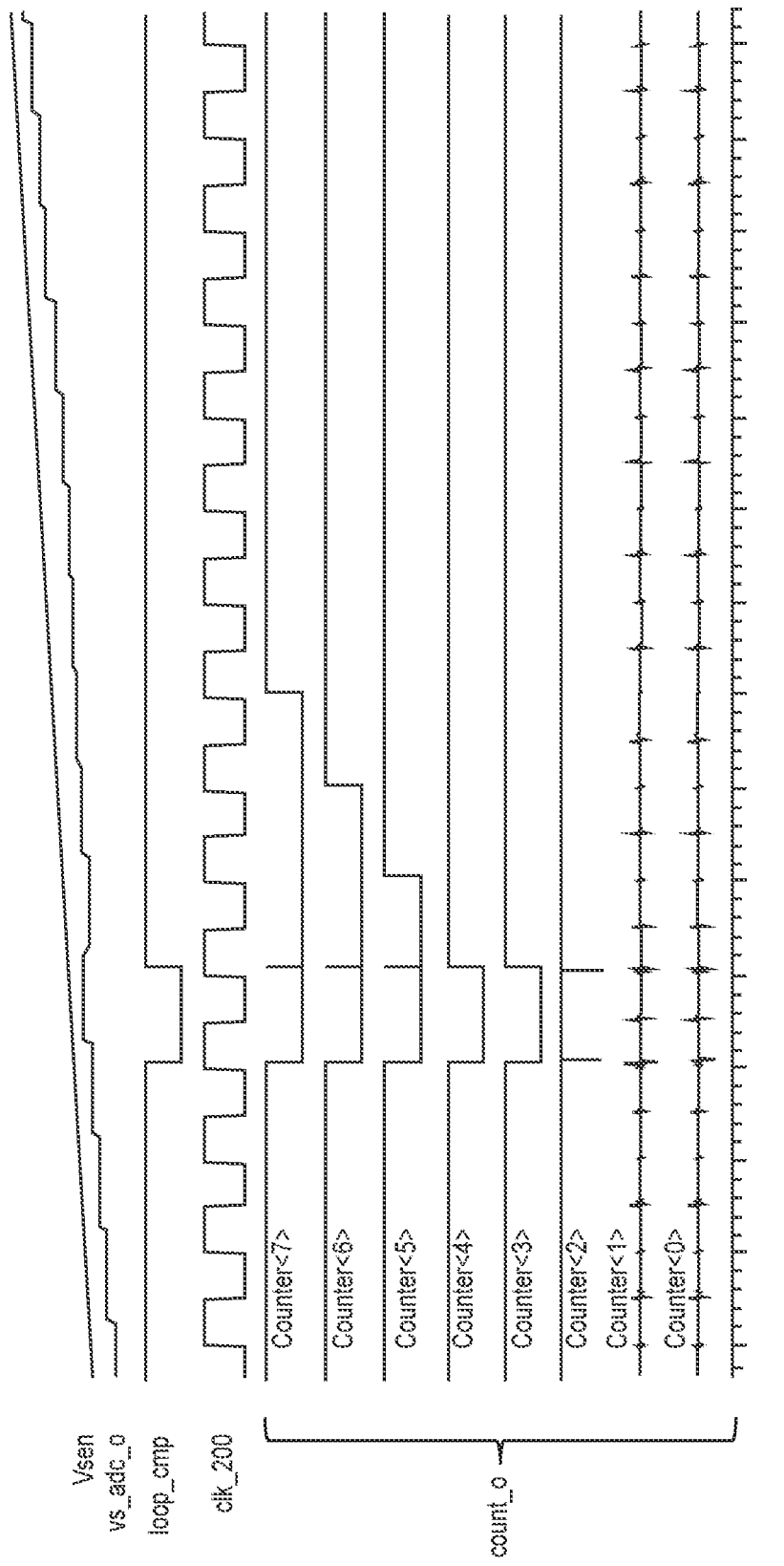

FIG. 5 illustrates a timing diagram of the counter function for an output voltage transition. During the output voltage transition, the counter 234 assists the first (main) tracking loop 122 to track the output voltage faster. The counter 234 saturates to the maximum high or low value but as soon as the error voltage Verror changes polarity, the counter 234 resets and starts to help in the steady state tracking. FIG. 5 shows an example output voltage ramp rate of 350 mV/us. When the power converter output Vout ramps high, the counter 234 counts high until saturating (e.g. at 11111111 for an 8-bit counter). When the first tracking loop 122 catches up to Vout, the comparator 206 switches polarity and the counter 234 is reset, e.g., to 00000111 for the 8-bit example.

Figure 6:
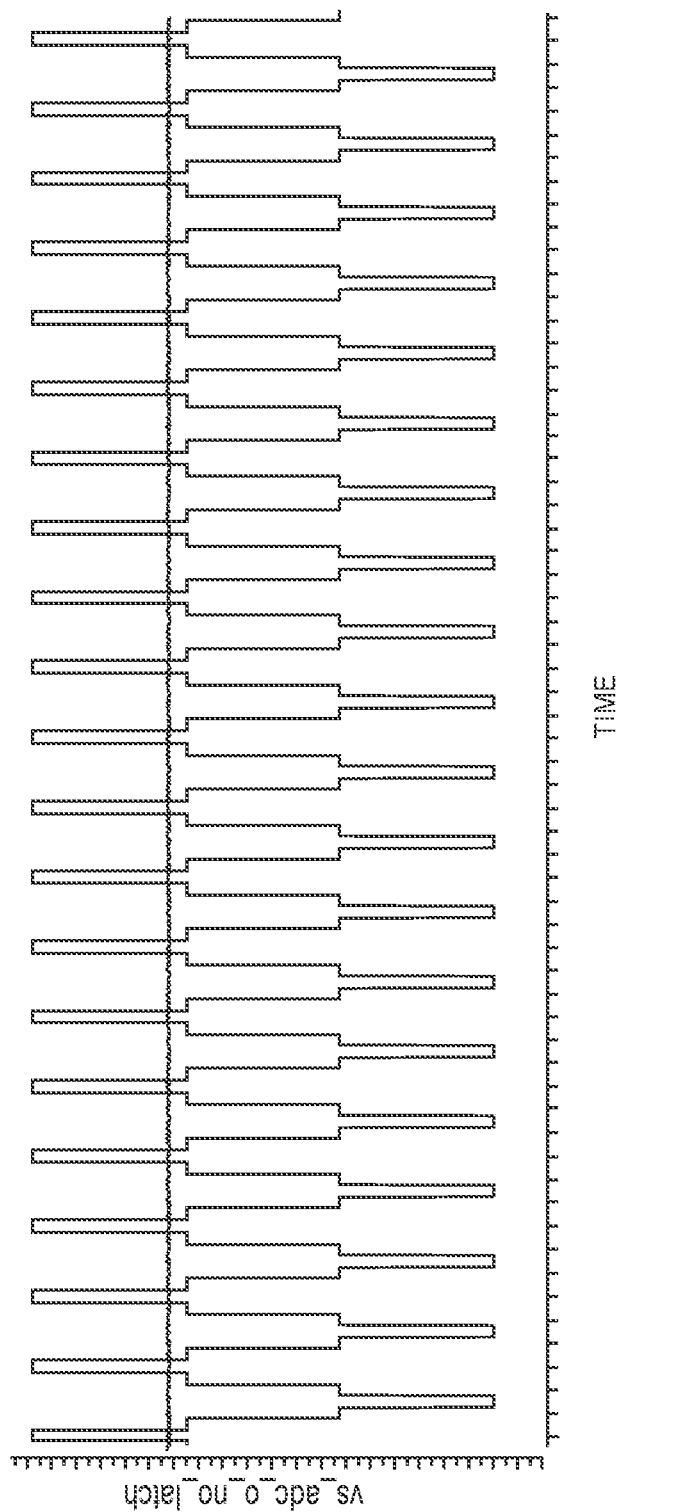
Figure 7:
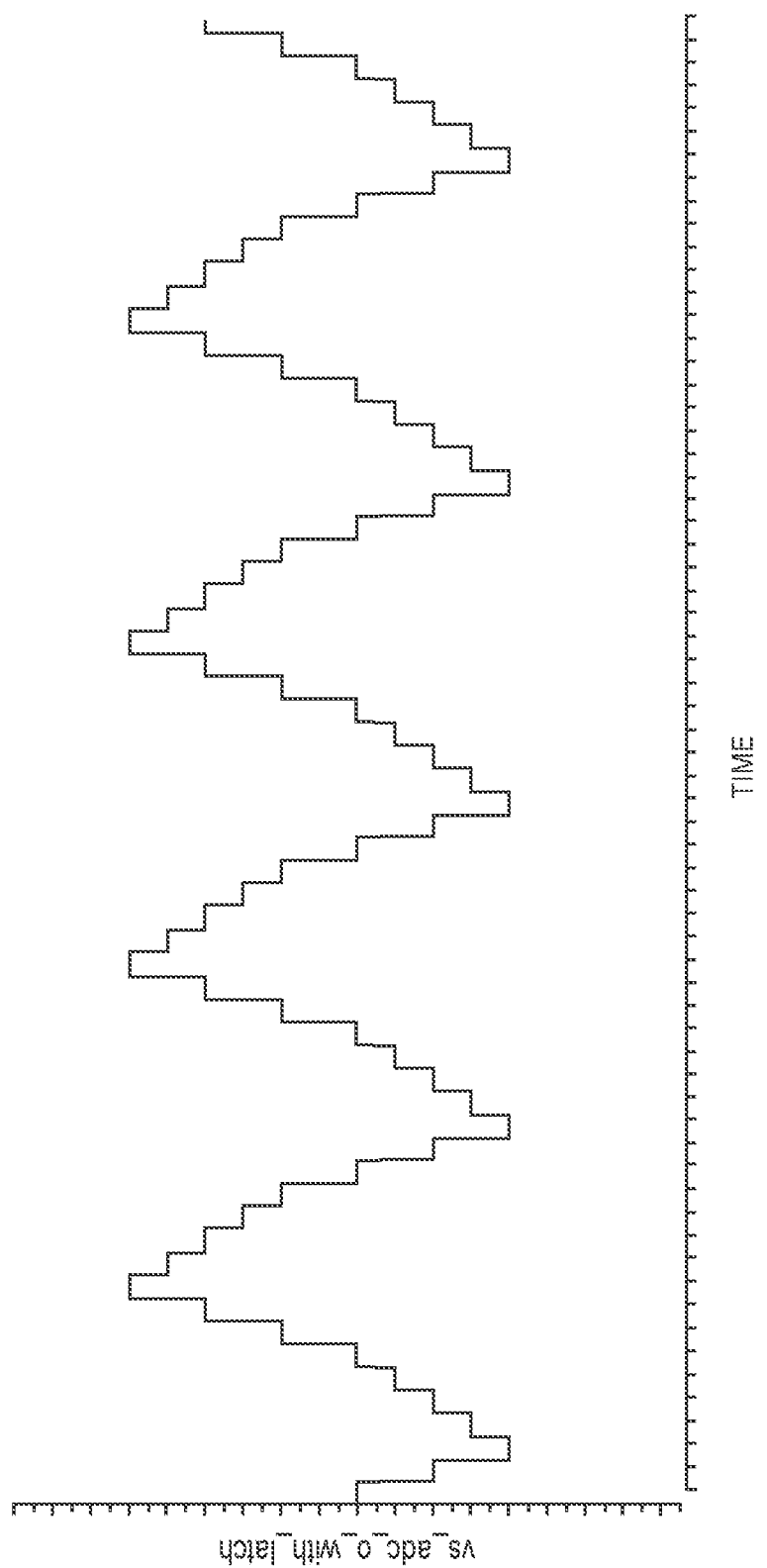
Figure 8:
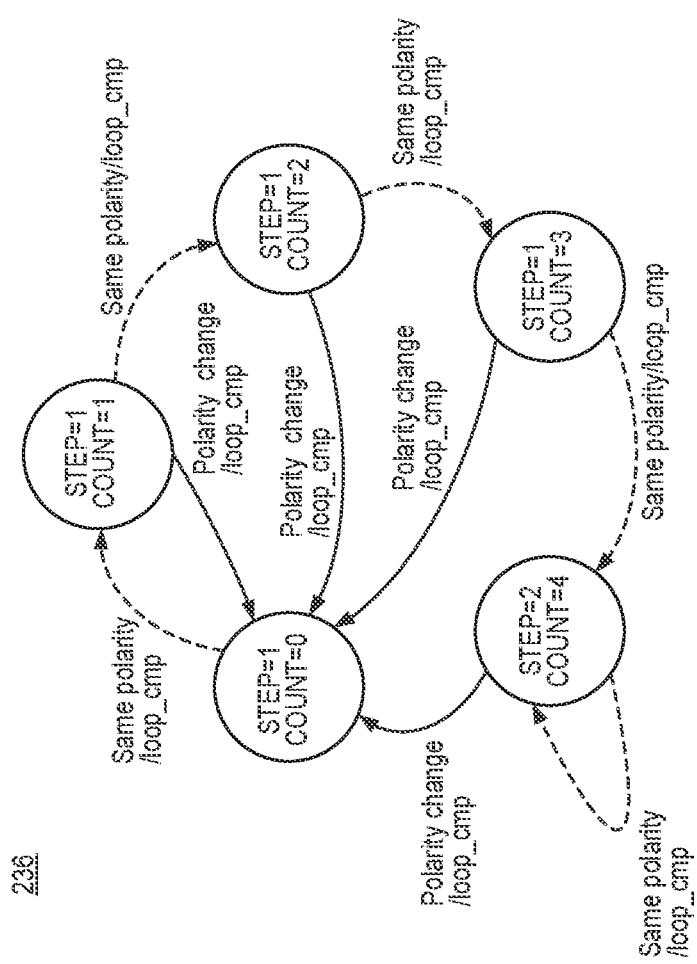
FIG. 8 illustrates a state machine diagram of an embodiment of step size control implemented by the tracking ADC.

FIGS. 6 and 7 contrast the steady-state code ripple at the output vs_adc_o of the tracking ADC 120 with the first latch 208 in the first tracking loop 122 (FIG. 7) and with the first latch 208 omitted from the first tracking loop 122 (FIG. 6). In FIG. 6, the bandwidth of the tracking loop is limited to 100 Mhz for the given input current requirements of the application and the tracking ADC output 'vs_adc_o_no_latch' has a four-code ripple since the 100 Mhz bandwidth limited tracking loop cannot settle at the 200 Mhz clock speed. In FIG. 7, adding the first latch 208 to the first tracking loop 122 solves the metastability issue but still results in code ripple in the tracking ADC output 'vs_adc_o_with_latch'. Without the auxiliary DAC 232, the main DAC 204 updates at least one full cycle later which means that 2 more codes of ripple are present at the tracking ADC output vs_adc_o_with_latch. If the step size state machine 236 of the first tracking loop 122 jumps to larger step sizes for consecutive loop comparator outputs, the step size incorrectly jumps to the higher size of 2, creating a worse output code ripple. FIG. 8 shows an embodiment of the step size state machine 236 used for step size selection. The output code ripple is dependent on the design of the step size state machine 236. Including the auxiliary DAC 232 and the counter 234 in the second tracking loop 124 of the tracking ADC 120 changes the steady-state output code ripple to 2 codes only as shown in FIGS. 4 and 5.

Operation of the step size state machine 236 shown in FIG. 8 is described next in more detail. For certain power converter applications, the ATRL/ATRH slew rate may be as high as 500 mV/us. During a load release, one region has the fastest slew rate. To track this region accurately and with minimal latency, additional features may be added to tracking ADC 120. For example, a variable step size may be implemented by the first tracking loop 122. If the tracking ADC 120 updates every 200 MHz or 5 ns, a step size of 2 can track 500 mV/us. A smaller step size for the first tracking loop 122 causes less noise on the output vs_adc_o of the tracking ADC 120 during steady-state when the first tracking loop 122 has converged to the output voltage. A larger step size results in a larger slew rate to track ATRL transients.

The state machine diagram shown in FIG. 8 illustrates an embodiment of variable step size implemented by the step size state machine 236. If the comparator output loop_cmp has the same polarity for more than one consecutive cycle, this indicates is a transient (dynamic load change) event and the power converter output voltage Vout will slew quickly. In this case, the step size state machine 236 increases the step size to a greater programmable value after a programmable number of consecutive cycles with the same comparator output polarity. In FIG. 8, the programmable number of consecutive cycles is 4. In general, the number of consecutive cycles of the same comparator output polarity for increasing the step size may be 2 or more. In FIG. 8, the step size is shown increasing from 1 to 2 after four consecutive cycles of the same comparator output polarity. In general, any size step increase may be implemented. Also, multiple step size increases may be implemented. For example, the step size may be increased every 2 or more consecutive cycles of the same comparator output polarity.

If the polarity of the comparator output loop_cmp changes, this indicates that the output vs_adc_0 of the tracking ADC 120 is close to the power converter output voltage Vout. In this case, the step size state machine 236 reduces the step size, e.g., back down to 1 as shown in FIG. 8. In this way, the output code ripple for the tracking ADC 120 will be very close to 1 code during steady state and does not run the risk of having a large ripple due to large step sizes. During a transient (dynamic load change) event, the step size state machine 236 changes to one or more larger step sizes after a few programmable cycles and the tracking ADC 120 tracks output voltage slew rates between 250 mV/us and step size*250 mV/us.

The counter 234 may be configured to track the number of consecutive clock cycles over which the polarity of the error value loop_cmp generated by the comparator 206 remains unchanged. As previously explained herein, the magnitude of the tracking reference adjustment generated by the second DAC 232 may correspond to the number of consecutive clock cycles over which the polarity of the error value loop_cmp generated by the comparator 206 remains unchanged.

Separately or in addition, the step size used by the first tracking loop 122 may be based on the count value generated by the counter 234 each clock cycle. For example, the output count_o of the counter 234 and which corresponds to the number of consecutive clock cycles over which the polarity of the error value loop_cmp generated by the comparator 206 remains unchanged may be input to the step size state machine 236 of the first tracking loop 122. In the case of the second DAC 232 being implemented as a thermometer coded DAC having a plurality of current cells each with a 1 LSB cell weight, the counter output count_o may be provided to the step size state machine 236 through an analog buffer 238, a digital latch 215 and a decoder 240 which decodes the counter value count_o from a thermometer coded value to a binary value.

According to this embodiment, the first tracking loop 122 determines the step size for adjusting the voltage tracking provided by the first tracking loop 122 based on the output count_o of the counter 234. For example, the first tracking loop 122 may output an ADC multi-bit code 'integ' that indicates the voltage tracking provided by the first tracking loop 122 and supplemented by the second tracking loop 124. The first tracking loop 122 may add the step size 'step_size' and the decoded counter output 'count_o_dec' to the ADC code 'integ_old' from the previous cycle, e.g., using a digital summing block or similar digital logic 242. The multi-bit code integ generated by the code update logic 210 may be decoded by a decoder 244 and stored by a latch 209. The MSB and LSB of the resulting code value code_value for the prior cycle are input to the main DAC 204 which generates a first tracking reference adjustment that corresponds to the input code value, as previously explained herein. The first tracking loop 122 tracks the sensed voltage input to the tracking ADC 120 with multi-cycle latency, as previously described herein.

The latency associated with the first tracking loop 122 is mitigated by the second tracking loop 124, which has single-cycle latency. Since the output code vs_adc_o generated by the tracking ADC 120 has a latency of two or more clock cycles, the second tracking loop 124 adds the step size and counter output back to the ADC output vs_adc_o to regain some of the total latency to ATRL detection. The timing diagram shown in FIG. 3 would save 2 clock cycles (or 10 ns for a 200 MHz clock signal) between 'integ_old' and 'vs_adc_o', where integ_old is the current value of the main DAC 204. Additionally, the feedforward term to reduce the latency may be added only when the state machine 236 changes the step size to a higher value such that noise does not degrade the steady state output code ripple. In this manner, latency reduction provided by the second tracking loop 124 may be applied only during a transient (dynamic load change) condition. For example, in the case of the power converter output voltage Vout slewing at a maximum expected rate of 500 mV/us, the code update logic 210 of the first tracking loop 122 lags the input signal (VSENP) by 15 ns while the final output vs_adc_o of the tracking ADC 120, which includes the feedforward terms of step size and counter output, only lags the input signal by 5 ns in this example.

Figure 9:
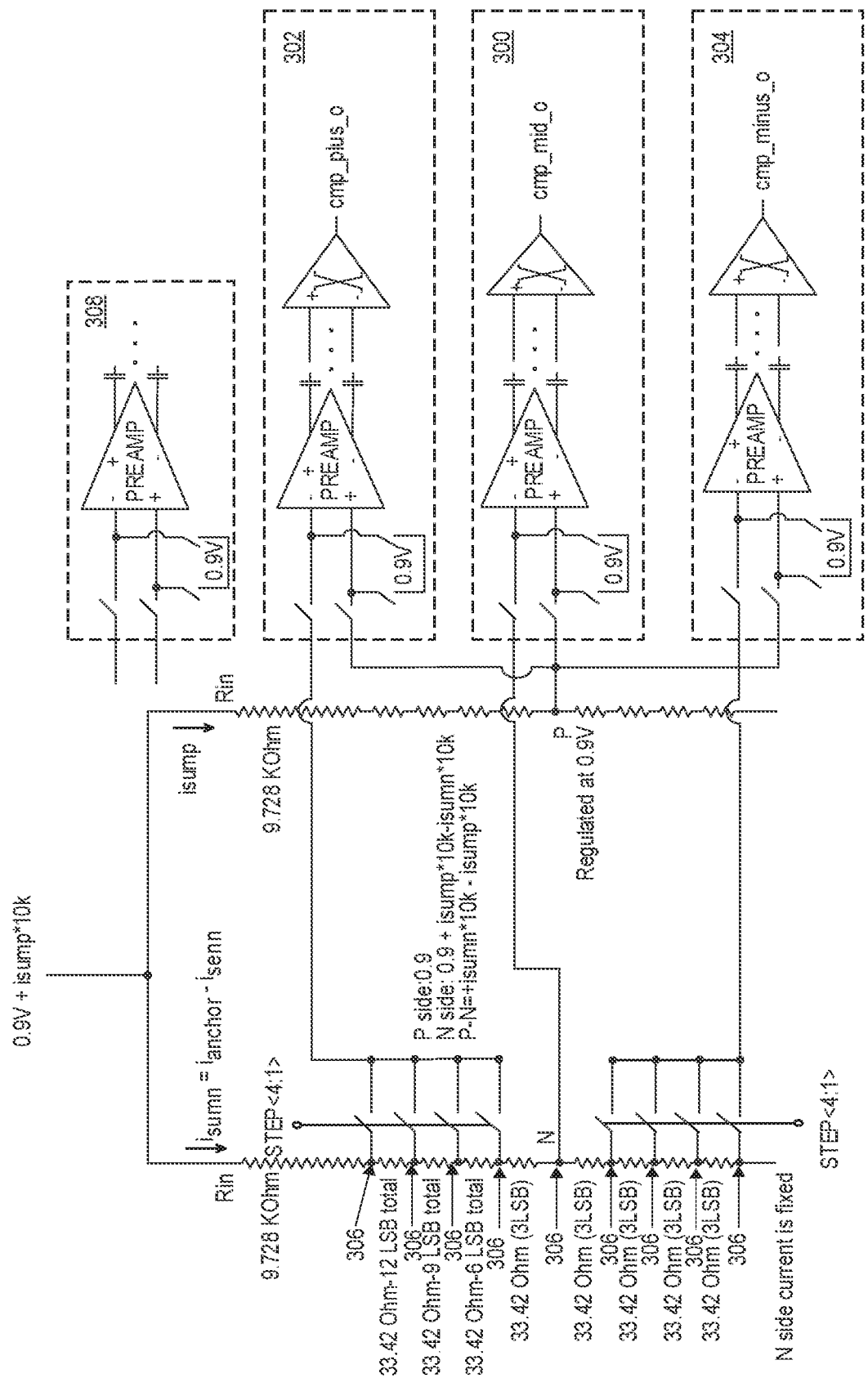
FIG. 9 illustrates a schematic diagram of an embodiment of a comparator of a first tracking loop included in the tracking ADC.

FIG. 9 illustrates an embodiment of the comparator of the first tracking loop 122. According to this embodiment, the resistors Rin and the comparator 206 included in the same dashed box in FIG. 2 are replaced by the circuit shown in FIG. 9. The circuit of FIG. 9 includes a middle comparator 300 with no offset and two window comparators 302, 304 with positive and negative offsets, respectively. The middle comparator 300 has an output 'cmp_mid' that changes state responsive to a polarity change in the error value stored by the first latch 208, as previously explained herein. The first window comparator 302 has an output 'cmp_plus_o' that changes state responsive to the error value stored by the first latch 208 exceeding a positive threshold +Vthr. The second window comparator 304 has an output 'cmp_minus_o' that changes state responsive to the error value stored by the first latch 208 exceeding a negative threshold −Vthr.

The first tracking loop 122 implements a minimum positive or negative step size for adjusting the voltage tracking provided by the first tracking loop 122 if the outputs of the middle comparator 300 and the window comparators 302, 304 are not in the same state during the same clock cycle. The first tracking loop 122 implements a maximum positive step size for adjusting the voltage tracking provided by the first tracking loop 122 if the outputs of the middle comparator 300 and the window comparators 302, 304 are in a same first state during the same clock cycle. The first tracking loop 122 implements a maximum negative step size for adjusting the voltage tracking provided by the first tracking loop 122 if the outputs of the middle comparator 300 and the window comparators 302, 304 are in a same second state during the same clock cycle.

Also in FIG. 9, the two resistors Rin are implemented as multiple segments with tap points 306 to create an offset for the window comparators 302, 304. The current through the N side of the circuit is fixed as 'ianchor−isenn' since isenn is always the same since VSENN is grounded. In this way, the thresholds are constant. The multiple comparators 300, 302, 304 create a greater capacitance load at the analog output of the first tracking loop 122 which causes a loss of bandwidth. If the overall clock rate is 200 Mhz, the window comparators 302, 304 provide greater step sizes for the first tracking loop 122. Using a 100 Mhz clock rate would relax the settling time at the analog output of the first tracking loop 122 but would require double the step sizes to track the same Vout transient as in the case of clocking at 200 Mhz. With multiple comparators 300-304, there are random offsets in each comparator 300-304 that are addressed by period auto-zeroing of the comparators 300-304. For this this reason, a fourth comparator 308 may rotate at any given time with the three main comparators 300-304. The resistance values shown in FIG. 9 are provided to illustrate example LSB totals for the first tracking loop 122 and should not be considered limiting in any way.

The middle comparator 300 checks the polarity of the first tracking loop output. The high and low window comparators 302, 304 each have a built-in offset which is proportional to the number of codes the tracking loop should step by in case of an output voltage transient event. The first tracking loop 122 takes a step by one code in either a negative or positive direction based on the output of the middle comparator 300. In this way, the first tracking loop 122 is always moving towards the input signal (Vout) every clock cycle which prevents the tracking ADC 120 from getting stuck in a dead band region. If one of the high or low comparators 302/304 triggers, the first tracking loop 122 takes a step by a larger step size based on the analog threshold of the corresponding comparator 302/304. Three comparators 300-304 have the advantage of error correction where all three comparators 300-304 have to agree on the direction of the step.

As shown in FIG. 10, only all comparators high ('1') would cause the high step code in the negative direction ('−HIGH STEP') whereas only all comparators low would cause a high step code in the positive direction ('+ HIGH STEP'). All other combinations would cause the first tracking loop 122 to use a step of one code ('1' or '−1'). In this way, the first tracking loop logic 122 has good noise tolerance and a low steady-state output ripple code.

The three-comparator embodiment shown in FIG. 9 uses three first latches 208 to re-clock the output of the respective analog latches of the comparators 300-304 on the opposite polarity clock as clk_200. The three-comparator solution also uses the analog feedback auxiliary DAC 232 to inject current into the first tracking loop 122, to make up for the latency introduced by the first latches 208 for solving the metastability issue described herein.

To track an ATRL event with the three-comparator solution, the comparator threshold 'Vthr' may be added by the digital summing block of the first tracking loop 122 in addition to the decoded counter output 'count_o_dec' and step size 'step_size' since if one of the window comparators 302, 304 is triggered, the error voltage is known to be at least the threshold of the comparator away from the input signal (Vout). In this way, the overall latency between the input voltage (Vout) slewing at 500 mV/us and the adjusted ADC output vs_adc_o can have a latency smaller than a clock cycle or 5 ns for a 200 MHz clock.

Figure 11:
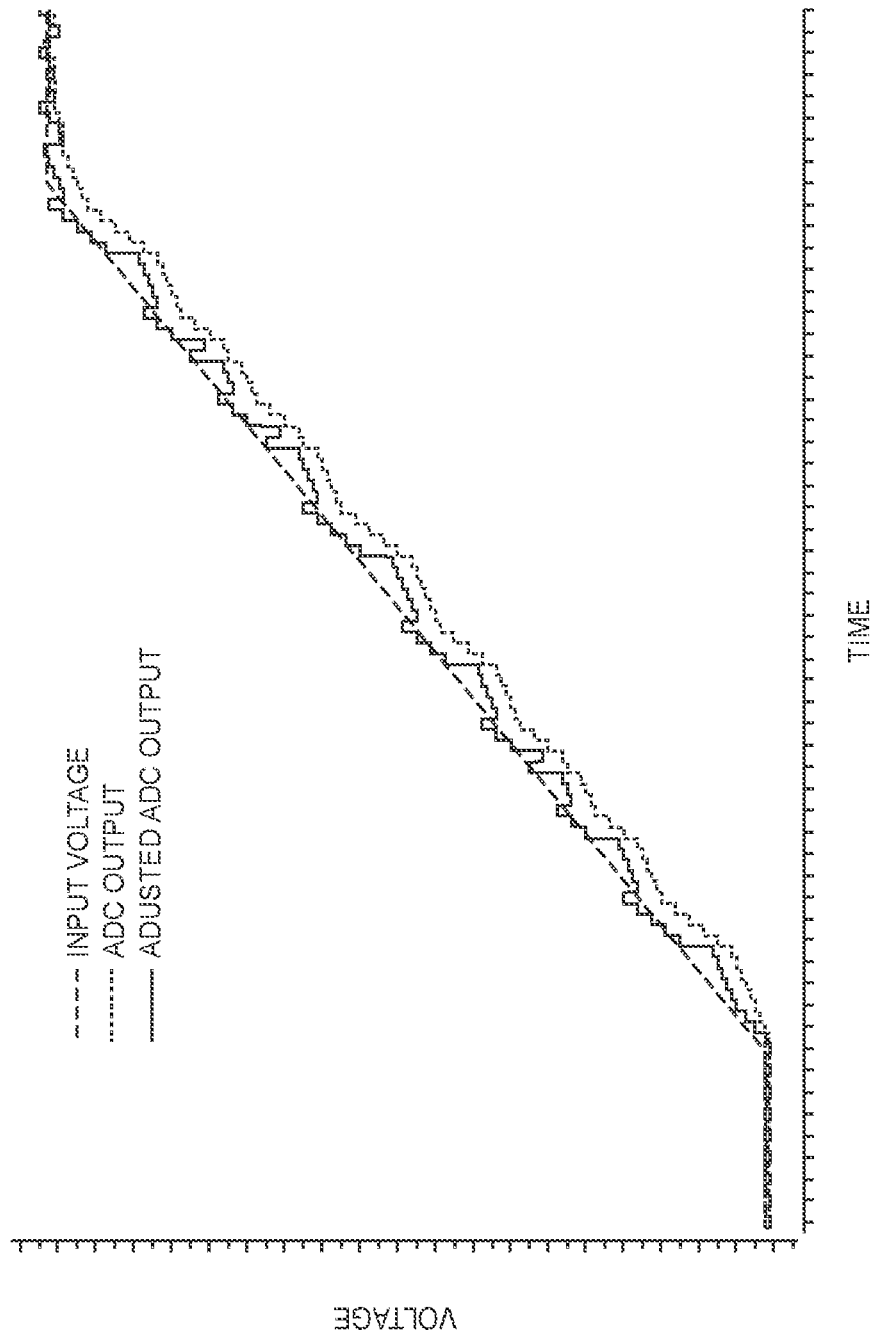
FIG. 11 illustrates a simulation result for the three-comparator embodiment shown in FIG. 9.

FIG. 11 illustrates a simulation result for the three-comparator solution and a step size of 3 when the window comparators 302, 304 are triggered. The counter output 'count_o', comparator threshold 'Vthr' and the step size 'step_size' are added to the ADC multi-bit code output 'integ' that indicates the voltage tracking provided by the first tracking loop 122. The modified code corresponds to the trace labelled 'Adjusted ADC output' in FIG. 11. This approach reduces the average delay between the input voltage (Vout) to the tracking ADC 120 to the output code vs_adc_o of the tracking ADC 120 from 18.5 ns to 4.7 ns for a 200 MHz clock, which is less than a single clock cycle of latency. This results in improved latency over the single-comparator solution, which is indicated by the trace labeled 'ADC output' in FIG. 11.

Figure 12:
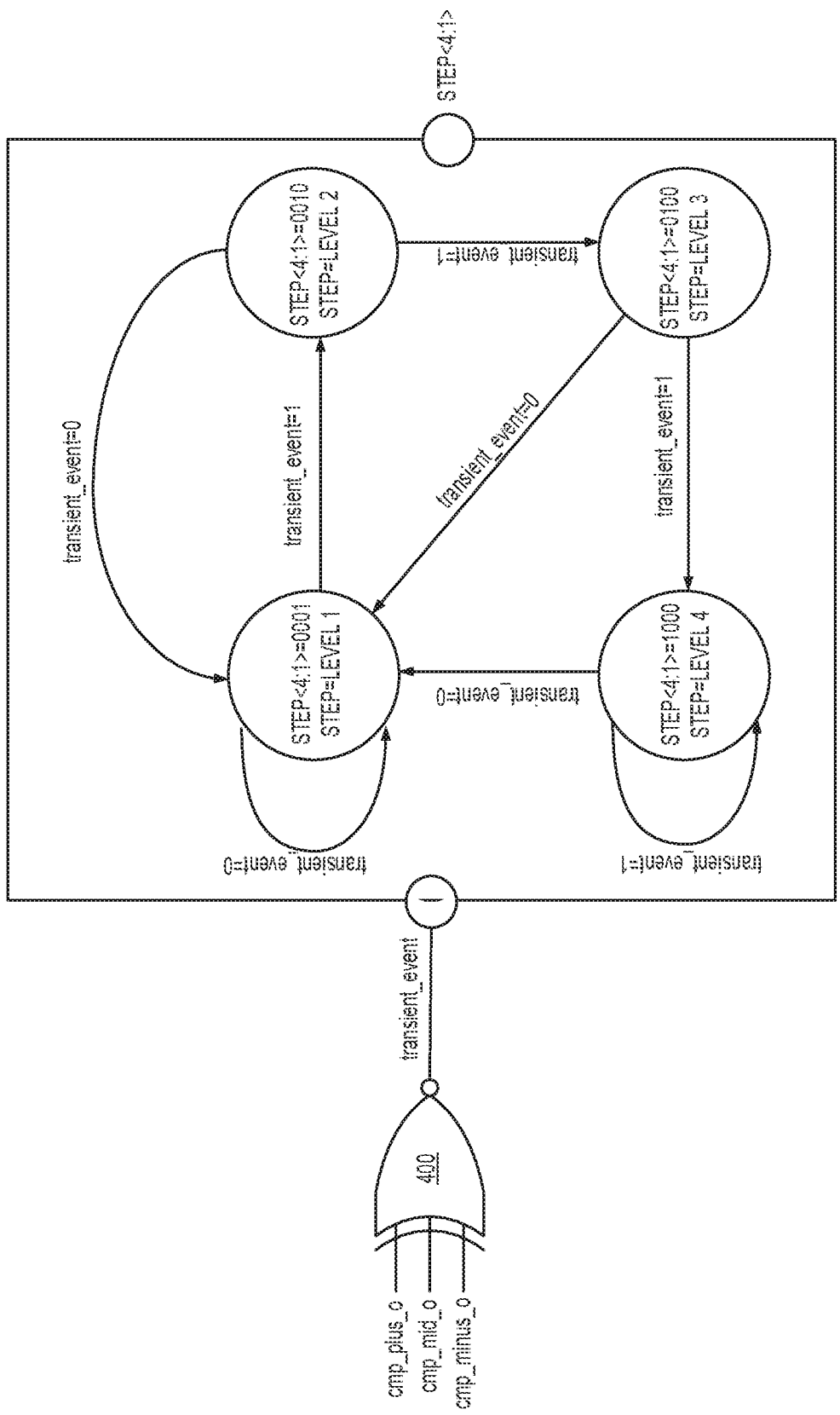
FIG. 12 illustrates a state machine diagram of an embodiment according to which thresholds of analog window comparators of the tracking ADC have dynamically varying thresholds.

FIG. 12 illustrates another embodiment according to which the thresholds of the analog window comparators 302, 304 have dynamically varying thresholds such that triggering either window comparator 302, 304 may increase the threshold of the window comparators 302, 304 for the next cycle. According to this embodiment, the window comparator inputs are connected to different tap points on the resistor legs as shown in FIG. 9. In this way, the tracking loop may track even steeper slew rates quickly. FIG. 12 shows the state machine implementation as in FIG. 8, but for variable thresholds. A transient (dynamic load change) event is detected by the XNOR 400 of the three comparator outputs as follows:

$$\text{transient\_event} = \overline{cmp\_plus\_o \oplus cmp\_mid\_o \oplus cmp\_minus\_o} \quad (5)$$

Under normal conditions, the first tracking loop 122 operates with the STEP<4:1> set to 0001 which is the lowest threshold setting for the window comparators 302, 304. The first tracking loop 122 would update in the next cycle with a step of 1 code. If there was a transient (dynamic load change) event, the thresholds Vthr of the window comparators 302, 304 are increased to STEP<4:1>=0010 and the step size would be set to the second level. Subsequent triggering of the window comparators 302, 304 increases the threshold Vthr of the window comparators 302, 304 and the step size of the first tracking loop 122. If the transient event detection resulted in zero, then the state machine 236 returns to the initial state with step size of 1.

According to the embodiment illustrated in FIG. 12, the first tracking loop 122 has a variable step size for adjusting the voltage tracking provided by the first tracking loop 122. The first tracking loop 122 outputs an ADC code 'vs_adc_o' that indicates the voltage tracking provided by the first tracking loop 122 and supplemented by the second tracking loop 124. The first tracking loop 122 adds the step size and the output of the window comparator 302/304 that triggered during a clock cycle to the ADC code. As explained above, the first tracking loop 122 may change the threshold of the window comparator 302/304 that triggered during the present clock cycle such that the threshold is different for the next clock cycle.

The tracking ADC described herein solves a metastability problem and poor transient tracking problems with conventional tracking loop ADCs. An analog, dynamic differential latch-based comparator is used to interface between analog and digital domains. The analog latch suffers from widely varying time to exit metastability over process corners which caused a significant probability of metastability leading to large errors in the integrator output. By adding the first latch on the dynamic side for capturing the output of the analog comparator, the metastability issue is eliminated but latency is introduced in the digital feedback to the analog tracking loop, causing large output code ripple. A second tracking loop having an auxiliary DAC and a counter are provided to create a fast feedback analog path to adjust the summing nodes in the tracking loop immediately based on the loop comparator output. The latency is then restored to 0 cycles and the output code ripple is reduced to 2 codes which is ideal. The tracking ADC described herein can track high slew rates of output voltage by using dynamic step size control with or without multiple comparators, and reduces latency by adding the counter output, step size, and dynamic threshold to the final output of the code update logic (e.g. integrator).

Although the present disclosure is not so limited, the following numbered examples demonstrate one or more aspects of the disclosure.

Example 1. A tracking analog-to-digital converter (ADC), comprising: a first tracking loop configured to track a voltage input to the tracking ADC, the first tracking loop having a multi-cycle latency which increases a residual error of the voltage tracking provided by the first tracking loop; and a second tracking loop configured to supplement the voltage tracking provided by the first tracking loop and to reduce the residual error of the voltage tracking for dynamic changes at the voltage input, the second tracking loop having a single-cycle latency.

Example 2. The tracking ADC of example 1, wherein the first tracking loop comprises: a first digital-to-analog converter (DAC) configured to generate a first tracking reference adjustment that corresponds to a code value input to the first DAC each clock cycle; a comparator configured to generate an error value each clock cycle based on the voltage input to the tracking ADC and the first tracking reference adjustment; and a first latch configured to store the error value generated by the comparator each clock cycle, wherein the comparator is actuated based on an edge of a clock signal that sets the frequency of each clock cycle and the first latch is actuated a fixed time after the comparator but before the clock cycle is completed.

Example 3. The tracking ADC of example 2, wherein the first tracking loop further comprises: an input configured to generate a differential current that corresponds to the voltage input to the tracking ADC; a first summing node coupled to a first differential leg of the input; and a second summing node coupled to a second differential leg of the input, wherein the first DAC is configured to inject the first tracking reference adjustment into at least one of the first and second summing nodes, and wherein a differential current at the first and second summing nodes is converted to a differential voltage at an input of the comparator.

Example 4. The tracking ADC of example 2 or 3, wherein the second tracking loop comprises: a second DAC configured to generate a second tracking reference adjustment based on the error value generated by the comparator each clock cycle.

Example 5. The tracking ADC of example 4, wherein the second DAC is configured to add 1 least significant bit (LSB) of current for a positive error value generated by the comparator each clock cycle and subtract 1 LSB of current for a negative error value generated by the comparator each clock cycle.

Example 6. The tracking ADC of example 4 or 5, wherein the second tracking loop further comprises: a counter configured to generate a count value based on the error value generated by the comparator each clock cycle, wherein the second tracking reference adjustment generated by the second DAC corresponds to the count value generated by the counter for the present clock cycle, and wherein the counter is updated at the end of the clock cycle.

Example 7. The tracking ADC of example 6, wherein the counter is configured to track a number of consecutive clock cycles over which a polarity of the error value generated by the comparator remains unchanged, and wherein the magnitude of the second tracking reference adjustment generated by the second DAC corresponds to the number of consecutive clock cycles over which the polarity of the error value generated by the comparator remains unchanged.

Example 8. The tracking ADC of example 7, wherein the counter has a first reset state that corresponds to a positive to negative change in the polarity of the error value generated by the comparator during a clock cycle and a second reset state that corresponds to a negative to positive change in the polarity of the error value, and wherein the second DAC is configured to subtract 1 LSB of current if the counter enters the first reset state during the clock cycle or add 1 LSB of current if the counter enters the second reset state during the clock cycle.

Example 9. The tracking ADC of any of examples 4 through 8, wherein the second DAC is a thermometer coded DAC having a plurality of current cells each with a 1 LSB cell weight, and wherein the thermometer coded DAC is configured to operate differentially with each current cell connecting either to the first differential leg or the second differential leg.

Example 10. The tracking ADC of example 9, wherein in a balanced state, the second DAC has a same number of current cells connected to the first differential leg as connected to the second differential leg.

Example 11. The tracking ADC of any of examples 6 through 10, wherein the first tracking loop is configured to use a smaller step size for adjusting the voltage tracking provided by the first tracking loop during steady state, wherein the first tracking loop is configured to use a larger step size for adjusting the voltage tracking provided by the first tracking loop during dynamic changes in the voltage input to the tracking ADC, and wherein the step size used by the first tracking loop is based on the count value generated by the counter each clock cycle.

Example 12. The tracking ADC of example 11, wherein the counter is configured to output a count that corresponds to a number of consecutive clock cycles over which a polarity of the error value generated by the comparator remains unchanged, and wherein the first tracking loop is configured to determine the step size for adjusting the voltage tracking provided by the first tracking loop based on the output of the counter.

Example 13. The tracking ADC of example 12, wherein the first tracking loop is configured to output an ADC code that indicates the voltage tracking provided by the first tracking loop and supplemented by the second tracking loop, and wherein the first tracking loop is configured to add the step size and the counter output to the ADC code.

Example 14. The tracking ADC of any of examples 2 through 13, wherein the first tracking loop further comprises: a first window comparator; and a second window comparator, wherein the comparator has an output configured to change state responsive to a polarity change in the error value stored by the first latch, wherein the first window comparator has an output configured to change state responsive to the error value stored by the first latch exceeding a positive threshold, wherein the second window comparator has an output configured to change state responsive to the error value stored by the first latch exceeding a negative threshold, wherein the first tracking loop is configured to implement a minimum positive or negative step size for adjusting the voltage tracking provided by the first tracking loop if the outputs of the comparator, the first window comparator and the second window comparator are not in a same state during the same clock cycle, wherein the first tracking loop is configured to implement a maximum positive step size for adjusting the voltage tracking provided by the first tracking loop if the outputs of the comparator, the first window comparator and the second window comparator are in a same first state during the same clock cycle, and wherein the first tracking loop is configured to implement a maximum negative step size for adjusting the voltage tracking provided by the first tracking loop if the outputs of the comparator, the first window comparator and the second window comparator are in a same second state during the same clock cycle.

Example 15. The tracking ADC of example 14, wherein the first tracking loop has a variable step size for adjusting the voltage tracking provided by the first tracking loop, wherein the first tracking loop is configured to output an ADC code that indicates the voltage tracking provided by the first tracking loop and supplemented by the second tracking loop, and wherein the first tracking loop is configured to add the step size and the output of the window comparator that triggered during a clock cycle to the ADC code.

Example 16. The tracking ADC of example 14 or 15, wherein the first tracking loop is configured to change the threshold of the window comparator that triggered during a clock cycle such that the threshold is different for the next clock cycle.

Example 17. The tracking ADC of any of examples 2 through 16, wherein the first tracking loop further comprises: a plurality of comparators configured to generate a multi-level representation of the error value; and a plurality of latches configured to store the values of the comparators.

Example 18. A method of tracking a voltage via a tracking analog-to-digital converter (ADC), the method comprising: tracking, via a first tracking loop of the tracking ADC, a voltage input to the tracking ADC, the first tracking loop having a multi-cycle latency which increases a residual error of the voltage tracking provided by the first tracking loop; and supplementing, via a second tracking loop of the tracking ADC, the voltage tracking provided by the first tracking loop and reducing the residual error of the voltage tracking for dynamic changes at the voltage input, the second tracking loop having a single-cycle latency.

Example 19. The method of example 18, wherein the tracking via the first tracking loop comprises: generating a first tracking reference adjustment each clock cycle and that corresponds to a code value; generating an error value each clock cycle based on the voltage input to the tracking ADC and the first tracking reference adjustment; and storing the error value generated each clock cycle.

Example 20. The method of example 19, wherein the supplementing via the second tracking loop comprises: generating a second tracking reference adjustment based on the error value generated each clock cycle.

Example 21. The method of example 20, wherein the supplementing via the second tracking loop of the tracking ADC further comprises: adding 1 least significant bit (LSB) of current for a positive error value generated each clock cycle; and subtracting 1 LSB of current for a negative error value generated each clock cycle.

Example 22. The method of example 20 or 21, further comprising: generating a count value based on the error value generated each clock cycle; and generating the second tracking reference adjustment based on the count value generated for the present clock cycle.

Example 23. The method of example 22, further comprising: tracking a number of consecutive clock cycles over which a polarity of the error value remains unchanged; and setting the magnitude of the second tracking reference adjustment based on the number of consecutive clock cycles over which the polarity of the error value remains unchanged.

Example 24. The method of any of examples 18 through 23, further comprising: adjusting the voltage tracking provided by the first tracking loop using a smaller step size during steady state; adjusting the voltage tracking provided by the first tracking loop using a larger step size during dynamic changes in the voltage input to the tracking ADC; generating a count value each clock cycle based on a polarity of the error value; and determining the step size used by the first tracking loop based on the count value.

Example 25. An electronic system, comprising: a circuit board; a load attached to the circuit board; and a power converter configured to provide an output voltage to the load, wherein the power converter comprises: at least one phase configured to provide a phase current to the load; and a controller configured to control switching of the at least one phase, wherein the controller comprises a tracking analog-to-digital converter (ADC) configured to measure the output voltage, wherein the tracking ADC comprises: a first tracking loop configured to track the output voltage, the first tracking loop having a multi-cycle latency which increases a residual error of the voltage tracking provided by the first tracking loop; and a second tracking loop configured to supplement the voltage tracking provided by the first tracking loop and reduce the residual error of the voltage tracking for dynamic changes in the output voltage, the second tracking loop having a single-cycle latency.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A tracking analog-to-digital converter (ADC), comprising:
a first tracking loop configured to track a voltage input to the tracking ADC, the first tracking loop comprising a first digital-to-analog converter (DAC) configured to generate a first tracking reference adjustment that corresponds to a code value input to the first DAC each clock cycle, a comparator configured to generate an error value each clock cycle based on a voltage input to the tracking ADC and the first tracking reference adjustment, and a first latch configured to store the error value generated by the comparator each clock cycle, wherein the comparator is actuated based on an edge of a clock signal that sets the frequency of each clock cycle and the first latch is actuated a fixed time after the comparator but before the clock cycle is completed; and a second tracking loop configured to supplement the voltage tracking provided by the first tracking loop and to reduce a residual error of the voltage tracking for dynamic changes at the voltage input, the second tracking loop having a single-cycle latency.

2. The tracking ADC of claim 1, wherein the first tracking loop further comprises:
an input configured to generate a differential current that corresponds to the voltage input to the tracking ADC;
a first summing node coupled to a first differential leg of the input; and
a second summing node coupled to a second differential leg of the input,
wherein the first DAC is configured to inject the first tracking reference adjustment into at least one of the first and second summing nodes, and
wherein a differential current at the first and second summing nodes is converted to a differential voltage at an input of the comparator.

3. The tracking ADC of claim 1, wherein the second tracking loop comprises:
a second DAC configured to generate a second tracking reference adjustment based on the error value generated by the comparator each clock cycle.

4. The tracking ADC of claim 3, wherein the second DAC is configured to add 1 least significant bit (LSB) of current for a positive error value generated by the comparator each clock cycle and subtract 1 LSB of current for a negative error value generated by the comparator each clock cycle.

5. The tracking ADC of claim 3, wherein the second tracking loop further comprises:
a counter configured to generate a count value based on the error value generated by the comparator each clock cycle,
wherein the second tracking reference adjustment generated by the second DAC corresponds to the count value generated by the counter for the present clock cycle, and
wherein the counter is updated at the end of the clock cycle.

6. The tracking ADC of claim 5, wherein the counter is configured to track a number of consecutive clock cycles over which a polarity of the error value generated by the comparator remains unchanged, and wherein the magnitude of the second tracking reference adjustment generated by the second DAC corresponds to the number of consecutive clock cycles over which the polarity of the error value generated by the comparator remains unchanged.

7. The tracking ADC of claim 6, wherein the counter has a first reset state that corresponds to a positive to negative change in the polarity of the error value generated by the comparator during a clock cycle and a second reset state that corresponds to a negative to positive change in the polarity of the error value, and wherein the second DAC is configured to subtract 1 LSB of current if the counter enters the first reset state during the clock cycle or add 1 LSB of current if the counter enters the second reset state during the clock cycle.

8. The tracking ADC of claim 5, wherein the first tracking loop is configured to use a smaller step size for adjusting the voltage tracking provided by the first tracking loop during steady state, wherein the first tracking loop is configured to use a larger step size for adjusting the voltage tracking provided by the first tracking loop during dynamic changes in the voltage input to the tracking ADC, and wherein the step size used by the first tracking loop is based on the count value generated by the counter each clock cycle.

9. The tracking ADC of claim 8, wherein the counter is configured to output a count that corresponds to a number of consecutive clock cycles over which a polarity of the error value generated by the comparator remains unchanged, and wherein the first tracking loop is configured to determine the step size for adjusting the voltage tracking provided by the first tracking loop based on the output of the counter.

10. The tracking ADC of claim 9, wherein the first tracking loop is configured to output an ADC code that indicates the voltage tracking provided by the first tracking loop and supplemented by the second tracking loop, and wherein the first tracking loop is configured to add the step size and the counter output to the ADC code.

11. The tracking ADC of claim 3, wherein the second DAC is a thermometer coded DAC having a plurality of current cells each with a 1 LSB cell weight, and wherein the thermometer coded DAC is configured to operate differentially with each current cell connecting either to the first differential leg or the second differential leg.

12. The tracking ADC of claim 11, wherein in a balanced state, the second DAC has a same number of current cells connected to the first differential leg as connected to the second differential leg.

13. The tracking ADC of claim 1, wherein the first tracking loop further comprises:
a middle comparator;
a first window comparator; and
a second window comparator,
wherein the middle comparator has an output configured to change state responsive to a polarity change in the error value stored by the first latch,
wherein the first window comparator has an output configured to change state responsive to the error value stored by the first latch exceeding a positive threshold,
wherein the second window comparator has an output configured to change state responsive to the error value stored by the first latch exceeding a negative threshold,
wherein the first tracking loop is configured to implement a minimum positive or negative step size for adjusting the voltage tracking provided by the first tracking loop if the outputs of the middle comparator, the first window comparator and the second window comparator are not in a same state during the same clock cycle,
wherein the first tracking loop is configured to implement a maximum positive step size for adjusting the voltage tracking provided by the first tracking loop if the outputs of the middle comparator, the first window comparator and the second window comparator are in a same first state during the same clock cycle, and
wherein the first tracking loop is configured to implement a maximum negative step size for adjusting the voltage tracking provided by the first tracking loop if the outputs of the middle comparator, the first window comparator and the second window comparator are in a same second state during the same clock cycle.

14. The tracking ADC of claim 13, wherein the first tracking loop has a variable step size for adjusting the voltage tracking provided by the first tracking loop, wherein the first tracking loop is configured to output an ADC code that indicates the voltage tracking provided by the first tracking loop and supplemented by the second tracking loop, and wherein the first tracking loop is configured to add the step size and the output of the window comparator that triggered during a clock cycle to the ADC code.

15. The tracking ADC of claim 13, wherein the first tracking loop is configured to change the threshold of the window comparator that triggered during a clock cycle such that the threshold is different for the next clock cycle.

16. The tracking ADC of claim 1, wherein the first tracking loop further comprises:
a plurality of comparators configured to generate a multi-level representation of the error value; and
a plurality of latches configured to store the values of the comparators.

17. A method of tracking a voltage via a tracking analog-to-digital converter (ADC), the method comprising:
tracking, via a first tracking loop of the tracking ADC, a voltage input to the tracking ADC, the first tracking loop having a multi-cycle latency which increases a residual error of the voltage tracking provided by the first tracking loop; and
supplementing, via a second tracking loop of the tracking ADC, the voltage tracking provided by the first tracking loop and reducing the residual error of the voltage tracking for dynamic changes at the voltage input, the second tracking loop having a single-cycle latency,
wherein the tracking via the first tracking loop comprises:
generating a first tracking reference adjustment each clock cycle and that corresponds to a code value;
generating an error value each clock cycle based on the voltage input to the tracking ADC and the first tracking reference adjustment; and
storing the error value generated each clock cycle,
wherein the supplementing via the second tracking loop comprises generating a second tracking reference adjustment based on the error value generated each clock cycle.

18. The method of claim 17, wherein the supplementing via the second tracking loop of the tracking ADC further comprises:
adding 1 least significant bit (LSB) of current for a positive error value generated each clock cycle; and
subtracting 1 LSB of current for a negative error value generated each clock cycle.

19. The method of claim 17, further comprising:
generating a count value based on the error value generated each clock cycle; and
generating the second tracking reference adjustment based on the count value generated for the present clock cycle.

20. The method of claim 19, further comprising:
tracking a number of consecutive clock cycles over which a polarity of the error value remains unchanged; and
setting the magnitude of the second tracking reference adjustment based on the number of consecutive clock cycles over which the polarity of the error value remains unchanged.

21. The method of claim 17, further comprising:
adjusting the voltage tracking provided by the first tracking loop using a smaller step size during steady state;
adjusting the voltage tracking provided by the first tracking loop using a larger step size during dynamic changes in the voltage input to the tracking ADC;
generating a count value each clock cycle based on a polarity of the error value; and
determining the step size used by the first tracking loop based on the count value.

22. An electronic system, comprising:
a circuit board;
a load attached to the circuit board; and
a power converter configured to provide an output voltage to the load,
wherein the power converter comprises:
at least one phase configured to provide a phase current to the load; and
a controller configured to control switching of the at least one phase,
wherein the controller comprises a tracking analog-to-digital converter (ADC) configured to measure the output voltage,
wherein the tracking ADC comprises:
a first tracking loop configured to track the output voltage, the first tracking loop comprising a first digital-to-analog converter (DAC) configured to generate a first tracking reference adjustment that corresponds to a code value input to the first DAC each clock cycle, a comparator configured to generate an error value each clock cycle based on the output voltage and the first tracking reference adjustment, and a first latch configured to store the error value generated by the comparator each clock cycle, wherein the comparator is actuated based on an edge of a clock signal that sets the frequency of each clock cycle and the first latch is actuated a fixed time after the comparator but before the clock cycle is completed; and
a second tracking loop configured to supplement the voltage tracking provided by the first tracking loop and reduce a residual error of the voltage tracking for dynamic changes in the output voltage, the second tracking loop having a single-cycle latency.

* * * * *